United States Patent [19]

Nishida et al.

[11] Patent Number: 4,916,482
[45] Date of Patent: Apr. 10, 1990

[54] APPARATUS FOR COMPOSING A PLURALITY OF ORIGINAL FILMS ON A BASE SHEET

[75] Inventors: Fumihiko Nishida; Osami Taniuchi; Hideaki Yonetani, all of Kyoto; Toru Kawada, Otsu; Tatsuo Yazaki, Kyoto, all of Japan

[73] Assignee: Ltd. Dainippon Screen Mfg. Co., Japan

[21] Appl. No.: 309,828

[22] Filed: Feb. 10, 1989

Related U.S. Application Data

[62] Division of Ser. No. 20,334, Feb. 27, 1987, Pat. No. 4,821,078.

[30] Foreign Application Priority Data

| Feb. 28, 1986 | [JP] | Japan | 61-41971 |
| Feb. 28, 1986 | [JP] | Japan | 61-41972 |
| Mar. 6, 1986 | [JP] | Japan | 61-47283 |
| Mar. 7, 1986 | [JP] | Japan | 61-31822 |
| Mar. 7, 1986 | [JP] | Japan | 61-31823 |
| Apr. 16, 1986 | [JP] | Japan | 61-86024 |
| Apr. 23, 1986 | [JP] | Japan | 61-92347 |

[51] Int. Cl.$^4$ .............................................. G03B 27/62
[52] U.S. Cl. ......................................... 355/75; 355/88
[58] Field of Search ...................................... 355/75, 88

[56] References Cited

U.S. PATENT DOCUMENTS

| 3,730,615 | 5/1973 | Woodier | 352/109 |
| 4,426,152 | 1/1984 | Sakamoto et al. | 355/75 |
| 4,599,122 | 7/1986 | Nakamura | 355/88 |

Primary Examiner—Monroe H. Hayes
Attorney, Agent, or Firm—Davis, Bujold & Streck

[57] ABSTRACT

An apparatus for composing original films, having register marks on desired positions of a base sheet, by positioning and adhering the original films on the base sheet, the apparatus includes a main frame, a positioning and composing table for supporting the base sheets, film cassettes, a position detecting stage on which one of the original films is placed, an original film carrier for transporting the original film from the film cassette to the stage, a working head which transports the original film from the positioning and composing table to a position where an adhesive is applied so that the original film can be adhered to the base sheet, photoelectrical sensors for detecting the register marks of the original film and measuring the position of the film, a sliding frame movable on the main frame in one direction, and a saddle slidable in a cross direction with the sliding frame to support the original film carrier and the working head.

8 Claims, 18 Drawing Sheets (CONVENTIONAL DEVICE)

APPARATUS FOR COMPOSING A PLURALITY OF ORIGINAL FILMS ON A BASE SHEET

This is a divisional of co-pending application Ser. No. 020,334 filed on Feb. 27, 1987 now U.S. Pat. No. 4821078.

BACKGROUND OF THE INVENTION

The present invention relates to an apparatus for composing a plurality of sets of color separations of, for example, yellow (Y), magenta (M), cyan (C), and black (BK), by adhering them on to desired positions of transparent base sheets for every separated color.

In a conventional photomechanical process, there has been work called "composing" in which a plurality of sets of original films, color separated by a color separation device such as a color scanner or the like, are adhered onto the base sheets of respective elemental colors by relatively positioning. This work is performed by positioning a plurality of sets of original films, in general one set consists of four sheets of original films such as Y, M, C and BK, and adhering them respectively on relatively identical positions of four base sheets for four elemental colors. Conventionally, this work has been carried out by hand with low efficiency, while requiring high proficiency.

An apparatus for automatically carrying out the composing work is disclosed in U.S. Pat. No. 4,599,122. This automatic apparatus comprises a frame, an original film storage case, a transporting device for transporting the original films, a registering light table, a base sheet storage case and a case for receiving the composed base sheets. In addition, four independent devices are provided on the frame. The first is a film picking-up device for picking up one sheet of original film from the base sheet storage case, the second is an original film moving device which provides a camera for optically detecting the register marks of the picked up original film, the third is an original film transporting and adhering device for transporting the original film attached thereto in X, Y and $\theta$ directions, and the last is a base sheet transporting device for transporting the base sheet. The above-described apparatus performs the "composing work" according to the following process.

Register marks are previously set at each of the corresponding positions of one set of the original films. This process is performed by recording the desired register marks together with the picture images, for example, in color separation work by a color scanner. According to a desired printing layout, each sheet of the first color (for example, yellow, hereinafter refer to as the "first color") among the plurality of sets of color separated original films is adhered to a base sheet by hand. By setting the base sheet on an adequate digitizer, the positions of the register marks of the first color original film are read out and stored in a memory. The first color original films adhered to the base sheet are removed from the base sheet and the original films and the base sheet are stored in their respective storage cases. Then, the apparatus is driven in sequence and the original film pick-up device picks up the original films from the original film storage case and sets them on the original film transporting device where positioning of the original film is roughly performed. Next, the original film moving device carries the original films to the registering light table where the positions of the register marks are read with the optical detecting camera. Simultaneously, the base sheet transporting device carries the base sheet from the base sheet storage case to the composing table and sets it thereon. Then, the original film transporting and adhering device holds the original film on the registering light table and the original film is aligned, according to the position data read out by the digitizer and the data optically detected by the detecting camera, to a desired position on the base sheet and set thereon. The original film is adhered thereon with an adhesive tape or the like. The afore-described process is repeated as necessary for the first color, and when all of the original films of the first color are composed on the base sheet, the base sheet is fed to the base sheet receiving case by the base sheet transporting device. The same process is repeated for the original films of the second and the following colors.

The above-described conventional composing apparatus can be carried out automatically, however, there are the following disadvantages. If the original films of the first color are not removed from the base sheet on which they were composed according to a desired layout by hand, and the base sheet is used in the following process with respect to original films of the second and the following colors, and if they are composed on the base sheet according to the data of composing position of the first color original films read out by the digitizer, position errors may sometime occur between the original films of the first color and those of the second color. The reason lies in that position reading of the register marks of the original films by the digitizer is carried out by aligning the cursor line of the digitizer by human eyes so that positioning errors on the order of a few hundred microns occur. Accordingly, this results in registering inaccuracy.

In the above described conventional apparatus, once the original films read out by the digitizer are all removed from the base sheet and the original films of all the separation colors are composed on the base sheets by the same process the inaccuracy is eliminated. Thus, positioning errors are prevented. According to this process, the position of all the original films of a plurality of separated colors can be aligned appropriately. However, in the first step gaps occur between the position of the original films composed by hand according to a desired layout and the actual positions to which the original films are adhered. In addition, in this process the original films are adhered to the desired position of the base sheet after elaborate alignment and the original films are adhered by the composing apparatus. As described, there is only a low working efficiency for this apparatus. Further, in the afore-mentioned apparatus, it is indispensably necessary to drive four kinds of transporting or moving devices along one axis or a plurality of axes, so that a complicated and large-scaled mechanism is required, and adjustment is necessary to keep the high accuracy.

SUMMARY OF THE INVENTION

It is the first object of the present invention to provide an automatic composing apparatus in which positions of the register marks of a plurality of original films of the first color composed on a base sheet according to a desired layout are optically detected on a detecting and composing table by an optical sensor, and by composing the original films of the second and those of the following colors according to the detected data, the original films of the second and the following colors are automatically aligned to positions corresponding to positions of the base sheet set on the detecting and composing table to be composed.

The second object of the present invention is to provide an automatic composing apparatus having a simple and compact construction which performs the aforedescribed object.

The third object of the present invention is to provide an automatic composing apparatus for composing original films which is provided with an original film transporting device to transport a plurality of original films piled on a storage stage to any desired position by holding with vacuum.

The fourth object of the present invention is to provide a sensing device for photoelectrically sensing positions of the register marks of the original films.

The fifth object of the present invention is to provide a film transporting device which holds and transports the original films on the composing table to press them on a base sheet set on the composing table by uniform pressure.

The sixth object of the present invention is to provide an automatic composing apparatus comprising an applying or adhering device which automatically applies strips of adhesive tape, for adhering original films held by the transporting device, to a desired portion thereof.

These and other objects, advantages and features of the present invention will become more fully apparent with reference to following description and accompanying drawings, wherein;

DETAILED DESCRIPTION OF PREFERRED EMBODIMENTS

The original film composing apparatus of the present invention is adapted to perform the following operation. Color separated original films of the first color are previously composed on a base sheet according to a desired layout, coordinates values of the register marks of the respective color separated original films are read out of the color separated original films by a position measuring device such as a digitizer or the like. A working head which comprises the register mark detecting sensor is moved in the X and Y directions and rotated around a vertical axis by moving means which is controlled by the obtained positioning data. The register marks of the original films composed on the base sheet of the first color which is set on the composing table according to the desired layout are detected and stored, and based on the stored data, the original films of the second color and those of the following colors are composed onto respective base sheets by performing an automatic positioning process.

Figure 1:
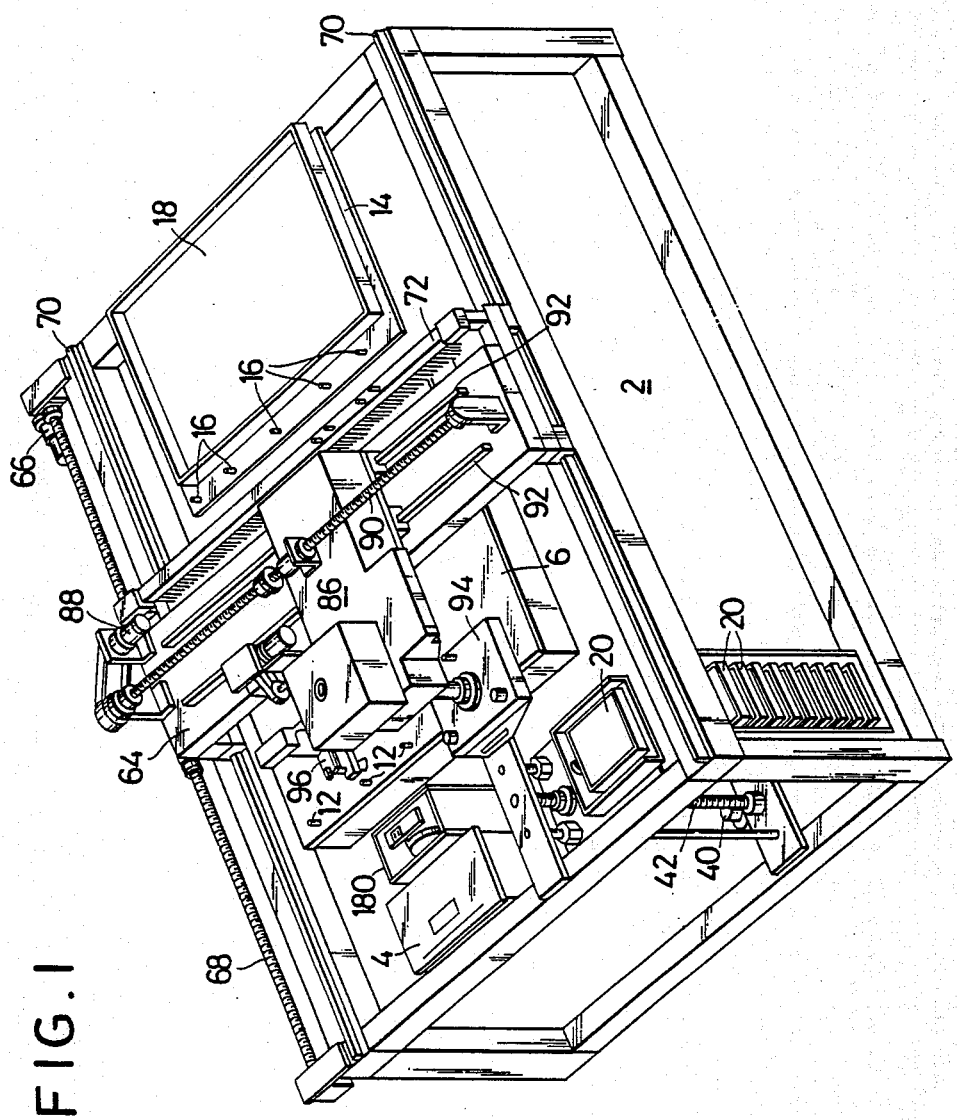
FIG. 1 is a general perspective view of an embodiment of the present invention in which the covers are removed.
Figure 2:
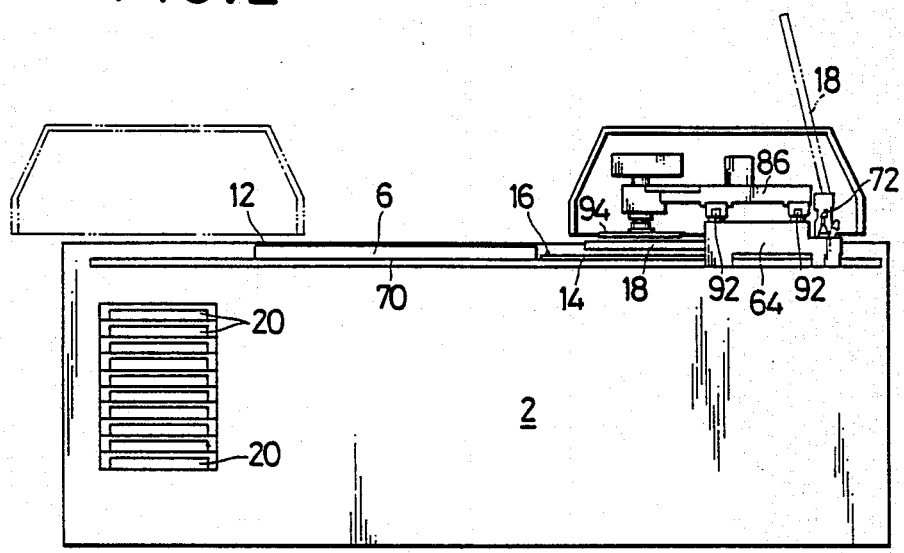
FIG. 2 is a schematic side view of the embodiment of the present invention.
Figure 3:
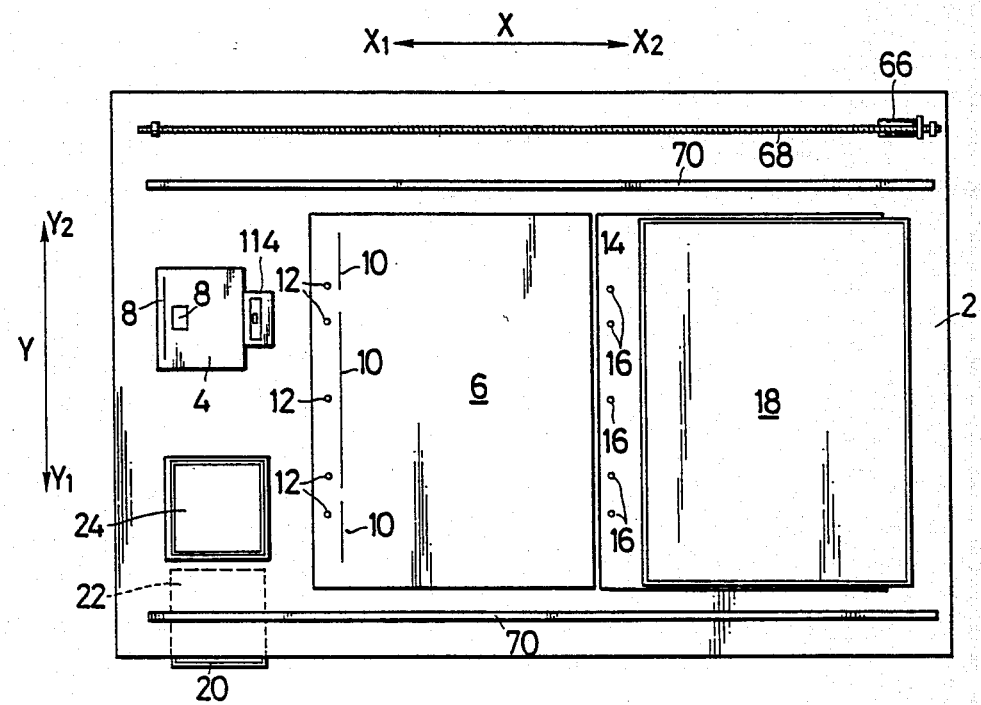
FIG. 3 is a plan view of the embodiment in which the sliding frame if removed.

FIGS. 1, 2 and 3 show a main frame 2, a position detecting stage 4 and a positioning and composing table 6. The surface of the position detecting stage 4 and the positioning and composing table 6 are made of an opaque material such as opal or grind glass, and lamps are provided inside for illumination. A groove 8 is cut on the surface of the stage 4 to which a vacuum pump and an air compressor (both of which are not shown) are connected. On the surface of the positioning and composing table 6, a groove 10 is cut which connects to the vacuum pump (not shown). At one side edge of the positioning and composing table 6, several register pins are provided for positioning the perforated film(s), and these register pins 16 project, in their normal position, inside the table when the film is set on the table. A base sheet supplying device 14 positions the plurality of base sheets, on which original films are to be composed, with the register pins 16. A base sheet receiving device 18 is provided on the base sheet supplying device 14, for receiving the base sheets on which composing work has been completed, and, with a pneumatic cylinder (not shown), it is raised up to the level of the dotted line shown in FIG. 2.

Film cassette and transport device for transporting the film cassette

Figure 4:
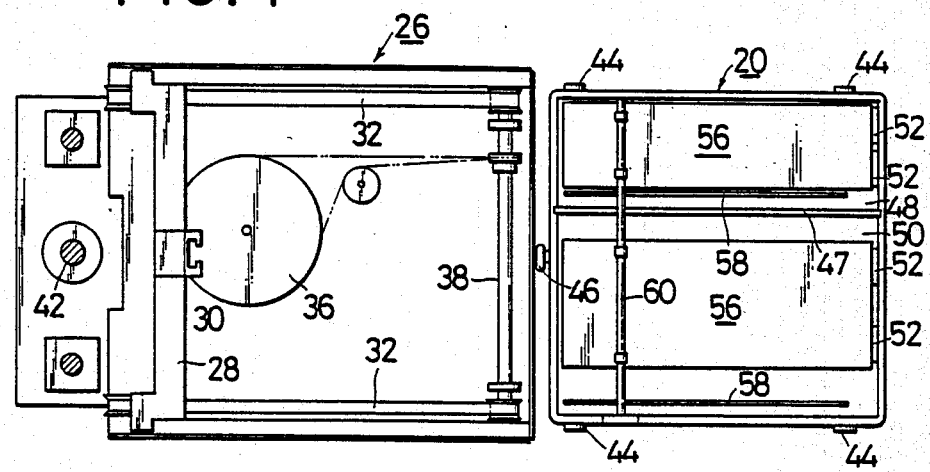
FIG. 4 shows a plan view of an original film cassette in relation to cassette driving means.
Figure 5:
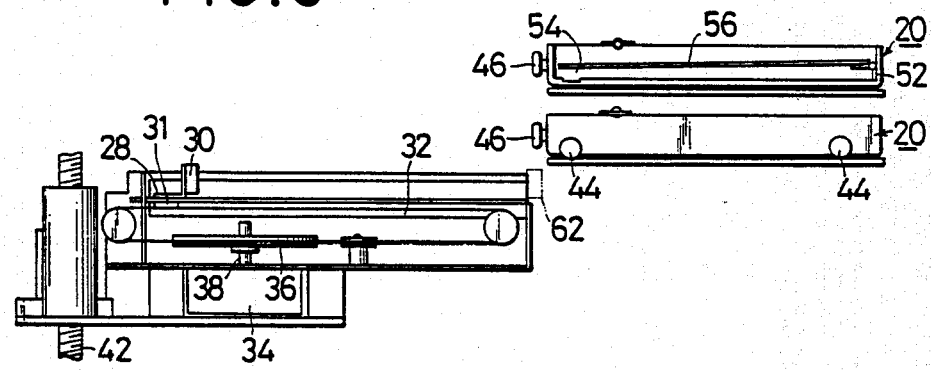
FIG. 5 shows a side view of the driving means as shown in FIG. 4.

A plurality of film cassettes 20, which store the original films to be adhered onto respective base sheets, are transported between a waiting position 22 and a supplying position 24. The relationship between the film cassette 20 and a driving means 26 of the film cassette 20 is shown in FIGS. 4 and 5. In FIG. 5, two cassettes (among the plurality of the cassettes) are illustrated and one of which is shown in sectional view. In FIGS. 4 and 5, a supporting bar 28 on which a hook receiver 30 is mounted is connected to a pair of driving belts 32 through a connector 31. The driving belts 32 are simultaneously driven through a shaft 38 by a pulley which is rotated by a rotary actuator 34. The cassette driving means 26 is vertically transported with a ball screw 42 driven by a motor 40 (shown in FIG. 1). Each of the film cassettes 20 is provided with two pairs of wheels 44, on both sides thereof, and a hook 46 is provided at the rear end thereof. The inside of the cassette 20 is divided into two sections 48 and 50 by a partition 47 to store two different size films, and a film lifting plate 56 is provided inside of each of the sections 48, 50, and one edge of plate 56 is hinged to the wall of the cassette 20 by a hinge 52 and actuated so as to lift with a spring 54. Also a side guide 58 and a suppression bar 60, which traverses an upper opening, are provided inside of each of the sections 48 and 50. Movement of the film cassette 20 from the waiting position 22 to the supplying position 24 is accomplished by moving the hook receiver 30 on the supporting bar 28 by driving the rotary receiver 34 to position 62, indicated by a chain line in FIG. 5, and then, by driving the ball screw 42 with the motor 40. The cassette driving means 26 aligns at a connecting height level with any desired film cassette. With this alignment, the hook 46 of the cassette is joined with the hook receiver 30, so that when the hook receiver 30 is returned by driving the rotary actuator 34 to the position indicated by the solid line, the cassette 20 is pulled toward the supplying position from the waiting position. Thereafter, the motor 40 is re-started to lift the cassette driving means 26, and the cassette 20 is aligned at the highest level for supplying the stored original films.

Sliding Frame

Figure 6:
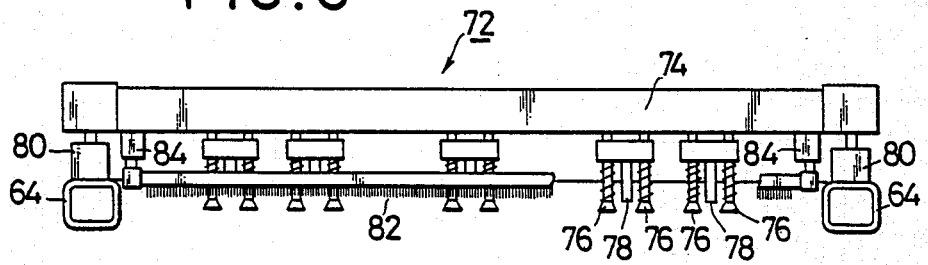
FIG. 6 is a front view of a transporting device for a base sheet.
Figure 7:
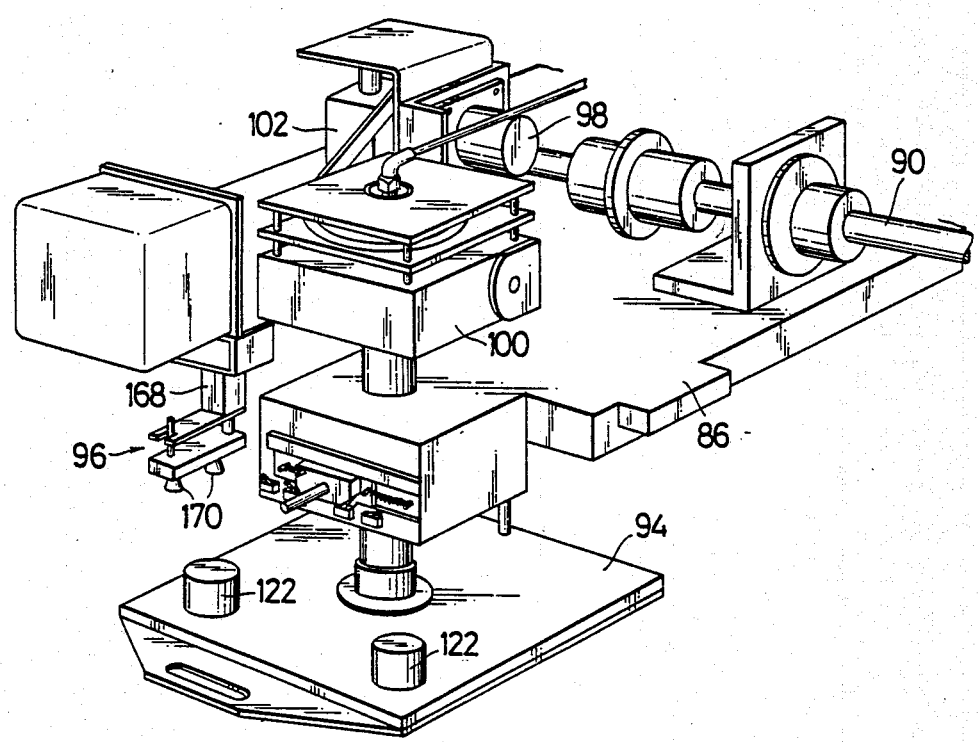
FIG. 7 is a perspective view of a driving means for driving a working head and an original film carrier.
Figure 8:
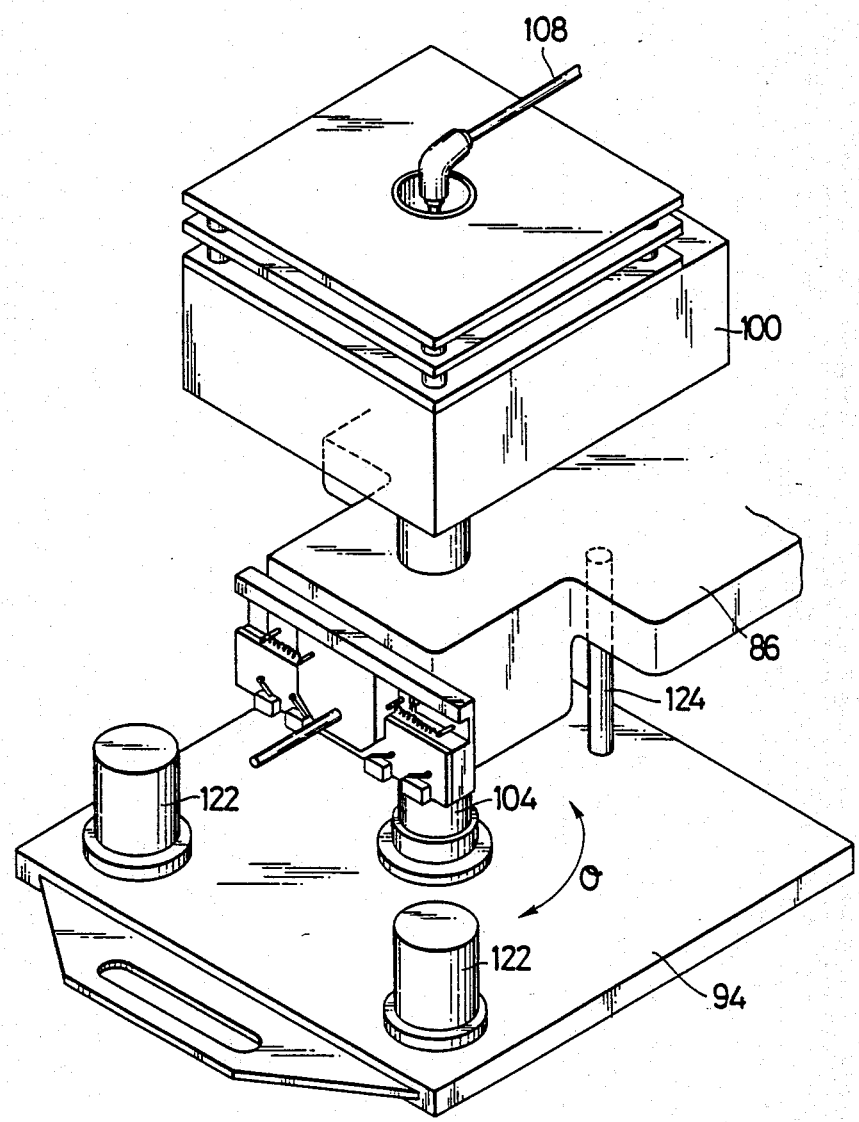
FIG. 8 is a perspective view of the working head.
Figure 9:
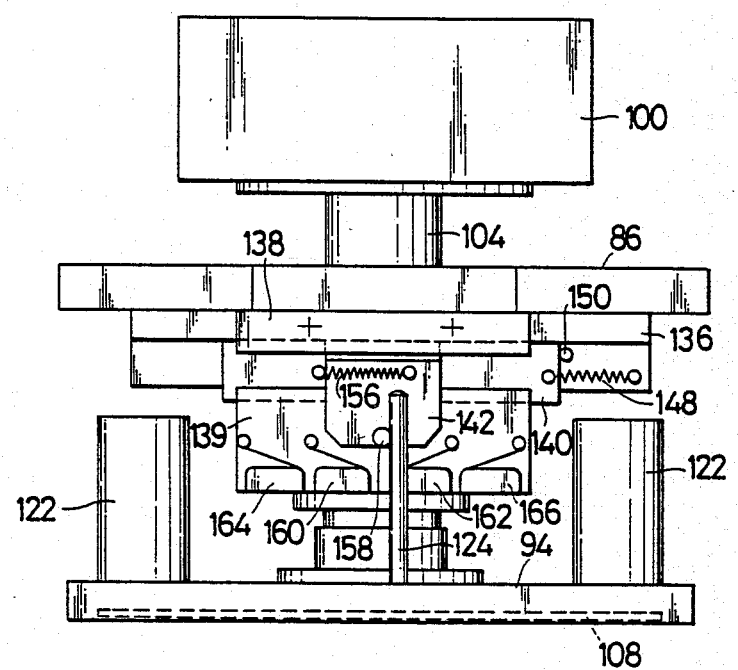
FIG. 9 is a front view of the working head.
Figure 10:
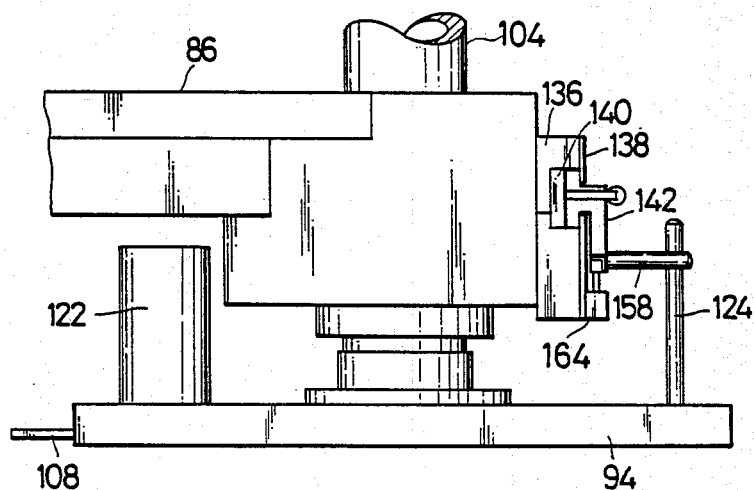
FIG. 10 is a side view of the working head.

Now turning to FIG. 1, a sliding frame 64 is driven in the $X_1$-$X_2$ directions shown in FIG. 3 along a pair of rails 70 on the main frame 2 by a ball screw 68 which is rotated by motor 66. A base sheet carrying means 72 is supported at the rear side of the sliding frame 64. The base sheet carrying means 72 is supported as follows. As shown in FIG. 6, a plurality of sets of suckers 76 and a plurality of sets retaining rods 78 are supported by a cross bar 74 which travels vertically by way of pneumatic cylinders 80. Additionally, a brush 82 is supported by pneumatic cylinders 84 mounted on both ends of the cross bar 74 so that it may be moved vertically. A saddle 86, which supports a working head 94 and an original film carrier 96, is driven by a ball screw 90 and motor 88 in the Y—Y directions, as shown in FIG. 3, along a pair of rails 92 on the sliding frame 64. The working head 94 is rotated, as shown in FIG. 7, by rotating a hollow shaft 104 with a motor 98 through a gear box 100, and further it is moved vertical by a pneumatic cylinder 102.

Working Head

With reference to FIGS. 8, 9, 10, 11 and 12, the working head 94 and the incorporated parts and means therein will be described hereinafter.

Figure 14:
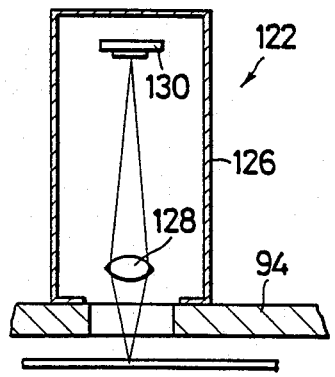
FIG. 14 is a sectional side view of an electronic sensor for detecting the register lines.

The working head 94 is installed on the hollow shaft 104 supported with the saddle 86 so that it may be rotated and moved vertically. The lower end of the hollow shaft 104 is fitted with a central opening 106, on the lower surface of the working head 94, and the upper end thereof is connected with a pipe 108 through the gear box 100. The pipe 108 is connected to a vacuum pump and an air compressor (not shown), through a suitable control valve (see FIG. 21), and it performs a sucking or blowing operation through central opening 106. Grooves 110 are cut on the lower surface of three sides of the working head 94 and a flexible board 107 is inserted therein, and a locking means 112, which engages with a hole 114 of the board 107, is provided for holding the board 107 in a set position. The flexible board 107 is made of a relatively thin plastic material, and a hole 116 is bored at the center thereof which aligns with the opening 106 when the board is inserted into the working head 94. A grid of shaped grooves 118 are bored on the lower surface of the board for holding the original films by sucking and grooves 120 connect the grid shaped grooves with the hole 116. A pair of sensors 122 and a pole 124 are installed on the upper side of the working head 94. The sensors 122 detect and measure the position of the register marks of the original film and the pole 124 serves as a stopper for determining a reference position when the working head 94 is rotated in relation with positioning switches, which are described hereinafter. The sensors 122 are each provided with a cover 126, a lens 128 and a photocell 130, as shown in FIG. 14. The photocell 130 is set at a position whereby images of the register mark lines are focused, when the working head 94 holds the original film(s). The photocell 130 detects positioning errors of the held original film by using the focused position of the images of the register mark lines.

Figure 15:
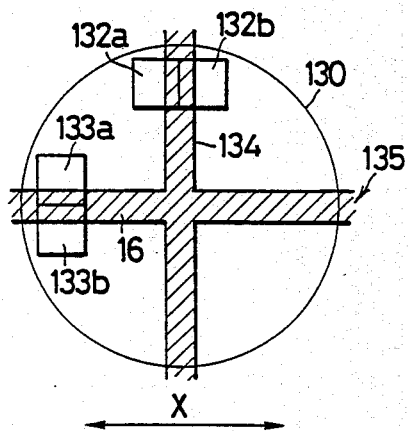
FIG. 15 shows a schematic diagram of a line detecting sensor.

Such photoelectric devices which detect positioning errors of such register marks have been publicly known, and one of the example is shown in FIG. 15 in which respective pairs of photoelectric transducers 132a, 132b and 133a, 133b are arranged on two center lines which cross each other at right angles, and when an image of the register mark line 134 or 135 is evenly projected to the photoelectric transducers 132a, 132b or 133a, 133b output levels of the two transducers are equal. However, when the image of the register mark 134 and 135 is unevenly projected, the output levels of the two transducers are not equal. The apparatus of the present invention detects, by utilizing the inequality of the output levels of the two transducers, whether or not the center of the register mark aligns with the optical axis of a sensor.

Again referring to FIGS. 8, 9, 10 and 11, a description of the switching device for controlling the starting point of rotation of the working head 94 will be given hereinafter. A horizontal guide rail 136, to which upper and lower guide plates are attached, is set at the front end of the saddle 86, and a base plate 140 and a saddle 142 are slidably inserted into these guide plates. The base plate 140 is energizingly actuated toward the stud 146, by means of a spring means 148 which is disposed between a stud 144 projecting from the base plate 140 and a stud 146 which is on the right end of the guide rail 136. The stroke of the base plate 140 is limited by a stopper 150 located at a suitable position on the guide rail 136. The saddle 142 is actuated toward a stud 154 by a spring means 156 provided between a stud 152 projecting from the saddle 142 and the stud 154 on the left end of the base plate 140. The saddle 142 slides to the right and left from a common position in which it touches with the stud 154. A contact bar 158 projects from saddle 142 to a position where it can touch the pole 124, when the working head 94 rotates. Accordingly, the base plate 140 is held in a neutral position where it touches stopper 150 and the saddle 142 is held in a neutral position where it touches stud 154. On the other hand, when the working head 94 is rotated so that the pole 124 may push the contact bar 158, the saddle 142 slides toward the direction in which it is pushed.

Figure 11:
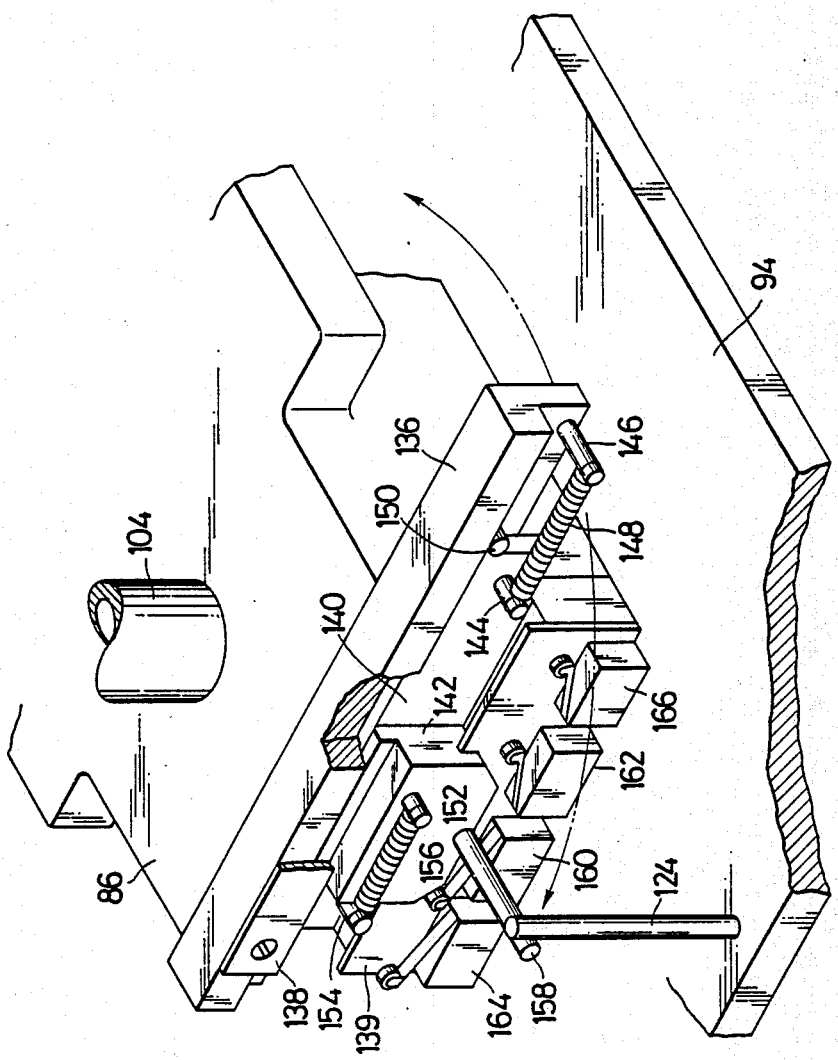
FIG. 11 is a perspective view of a rotating position control device for the working head.
Figure 12:
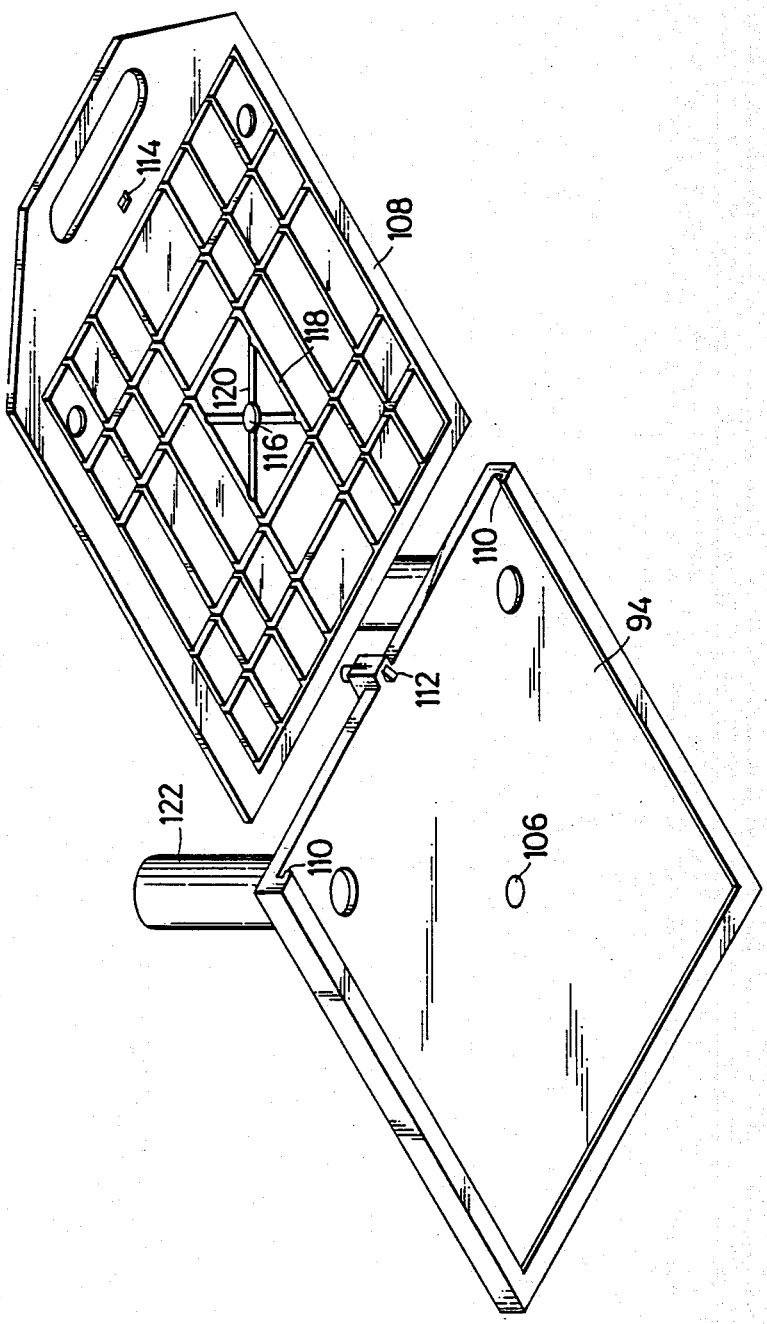
FIG. 12 is a perspective bottom view of the working head.
Figure 16:
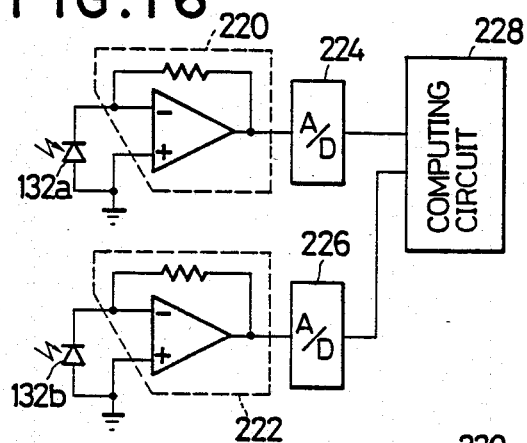
FIG. 16 shows an embodiment of a control circuit for a detecting device in a composing head.
Figure 17:
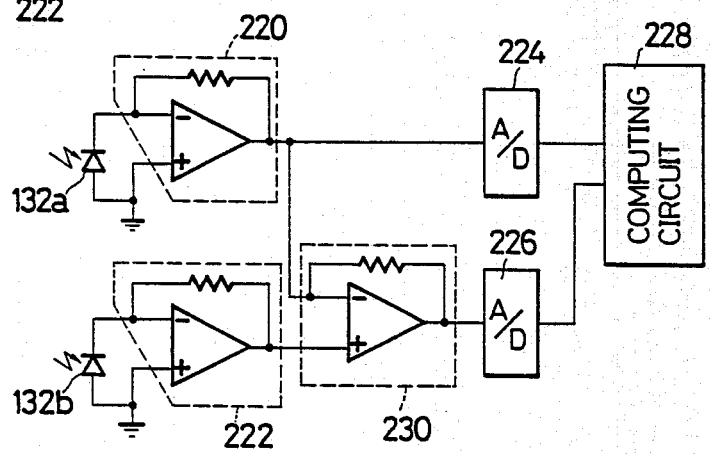
FIG. 17 is another embodiment of the control circuit.
Figure 19:
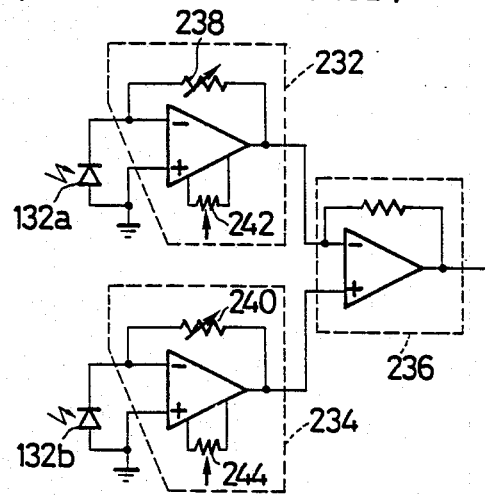
FIG. 19 shows a conventional control circuit.
Figure 20:
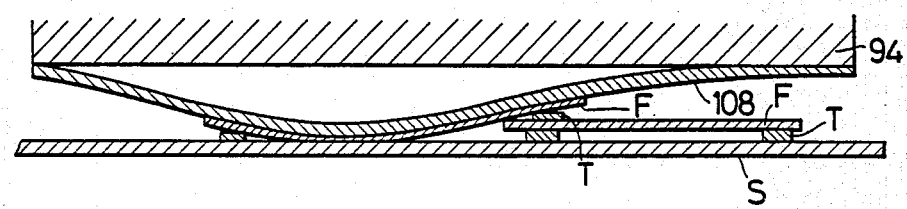
FIG. 20 shows a schematic section view of an original film held on the bottom face of the composing head.

Four limit switches 160, 162, 164 and 166 are provided on the lower front part of the guide rail 139 so that each of their actuating levers may be pushed down by a bevelled lower edge of the saddle 142 when it shifts. Two 160, 162 of the four switches are inside the others and they detect limit points of the rotating stroke of the working head 94, and they generate a starting position signal for controlling rotation. As shown in FIG. 11, the starting point of the working head 94 is determined from a point where the working head 94 is rotated clockwise, and the saddle 142 is shifted in the left direction to actuate the switch 160. In determining the starting point, it is preferable to determine the starting point as the point at which the actuating lever of the switch 160 is pushed-down by the saddle 142, and the switch 160 is turned to the OFF state, thereafter the clockwise rotation of the working head 94 is stopped, and then the working head 94 starts a counterclockwise rotation to reverse the saddle 142 so that the switch 160 may be turned to the ON state. The remaining two switches 164, 166, provided on the outside, are emergency switches which stop the entire apparatus when, because of electrical or mechanical hindrance, the rotation of the working head 94 does not stop even after the saddle 142 touches either inside switch 160, 162. FIGS. 16, 17 and 19 show electrical circuits for detecting the register mark line by using the sensor 122, and FIG. 20 shows a state in which an original film held on a base sheet is pressed by the working head 94.

A description with respect to those particular figures will be given together with the function of the whole apparatus hereinafter.

Original Film Carrier

Figure 21:
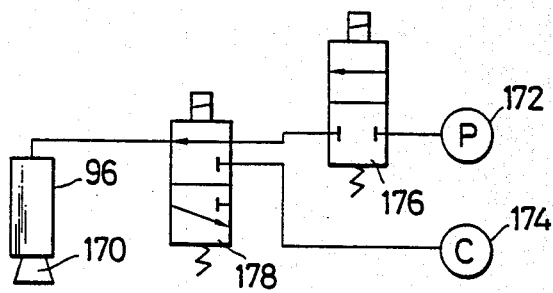
FIG. 21 is a schematic block diagram of an original film carrying system.
Figure 22A:
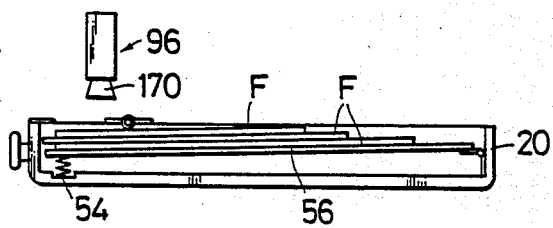
FIGS. 22A through 22D show processes for original film carrying operation.
Figure 22B:
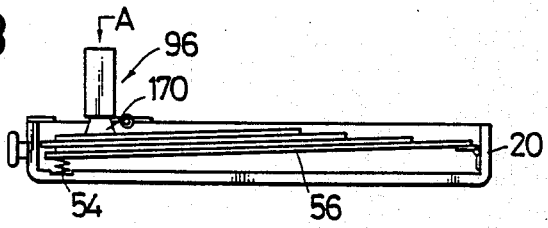
Figure 22C:
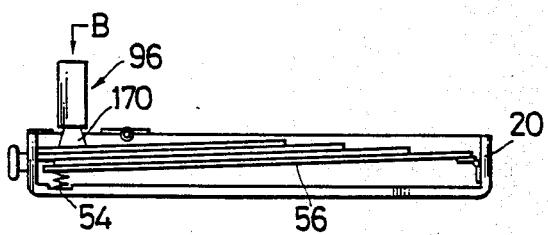
Figure 22D:
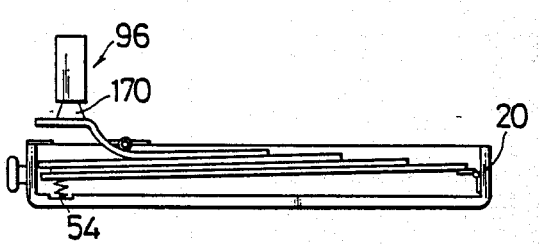

As shown in FIG. 7, an original film carrier 96, which picks-up original films from the cassette, is provided on the saddle 86 along with the working head 94. The original film carrier 96 carries a plurality of suckers 170 which are vertically movable by a pneumatic cylinder 168. These suckers 170 are selectively connected to, as shown in FIG. 21, either a vacuum pump 172 or an air compressor 174 through electromagnetic valves 176, 178. The suckers connected to the vacuum pump hold and carry an original film, and the air compressor 174 smoothly removes the original film held by the suckers. FIGS. 22A through 22D illustrate a process by which the working head 94 holds the uppermost sheet of the original film stored in the film cassette 20 and piled up on the lifting plate 56 of the cassette 20. In these figures the thickness of the original films (F) is exaggerated. By driving the sliding frame 64 and the saddle 86 with the motors 66 and 88, the suckers 170 of the original film carrier 96 coincided with the position of the original film cassette 20 set at the supplying position 24. With reference to FIG. 22A, the pneumatic cylinder 168 is activated to cause the original film carrier to descend and, as shown in FIG. 22B, the suckers 170 and the uppermost sheet of the original film (F) are in contact with each other at a first position (A). Then, through movement of the saddle 86, the suckers 170 are shifted to the left. Because of the friction generated between the suckers and the film, the uppermost sheet of film is shifted in the same direction until the left edge of the sheet of film touches with the wall of the cassette. After the edge touches the wall, the suckers slip over the surface of the film until they stop at a second position (B), shown in FIG. 22B. When the suckers 170 are in the second position (B), the left edge of the upper most sheet of film fully contacts with the wall of the cassette 20. This function is carried out smoothly since the films (F) are pressed against the suckers 170 under constant pressure by the spring means 54 which lifts the lifting plate 56. Next, by operation of the electromagnetic valve 176, the suckers 170 hold the original films (F) by vacuum (FIG. 22C). Subsequently, the film carrier 96 is raised by the pneumatic cylinder 168, as shown in FIG. 22D, and the original film held thereon is picked-out of the film cassette 20. Then, because of movement of the saddle 86, the original film carrier 96 is transported to the left and the original film (F) is carried to the position detecting stage 4.

The travel stroke of the suckers from the first position (A) to the second position (B) may be selected to accommodate different edge positions of the original films piled in the film cassette, however, it is indispensably necessary for the stroke to be selected so that the uppermost sheet of film in the film cassette may contact it when the suckers descend. The stroke can be made 12 millimeters less by suppressing the surface of the uppermost sheet of the pile of film (F) with the suppression bar 60 (shown in FIG. 4). In each of FIGS. 22A, 22B, 22C and 22D, by contacting the left edge (corner) of the film to be carried with the wall of the film cassette, positioning of the film is performed. However, any separated part or parts for positioning may be provided therewith as an appendix or appendicies. In addition, by driving the sliding frame 64 and the saddle 86, positioning in two directions is also possible. Diagonal movement is also possible by driving both components simultaneously, or driving each component individually, one at a time. Each of the original films held by the carrier 96 is transported to the position detecting stage 4, and by detecting the register mark lines with the photoelectric sensor 122, they are accurately aligned and held by the working head 94. Detailed description regarding the afore-mentioned function will be developed hereinafter.

Figure 23A:
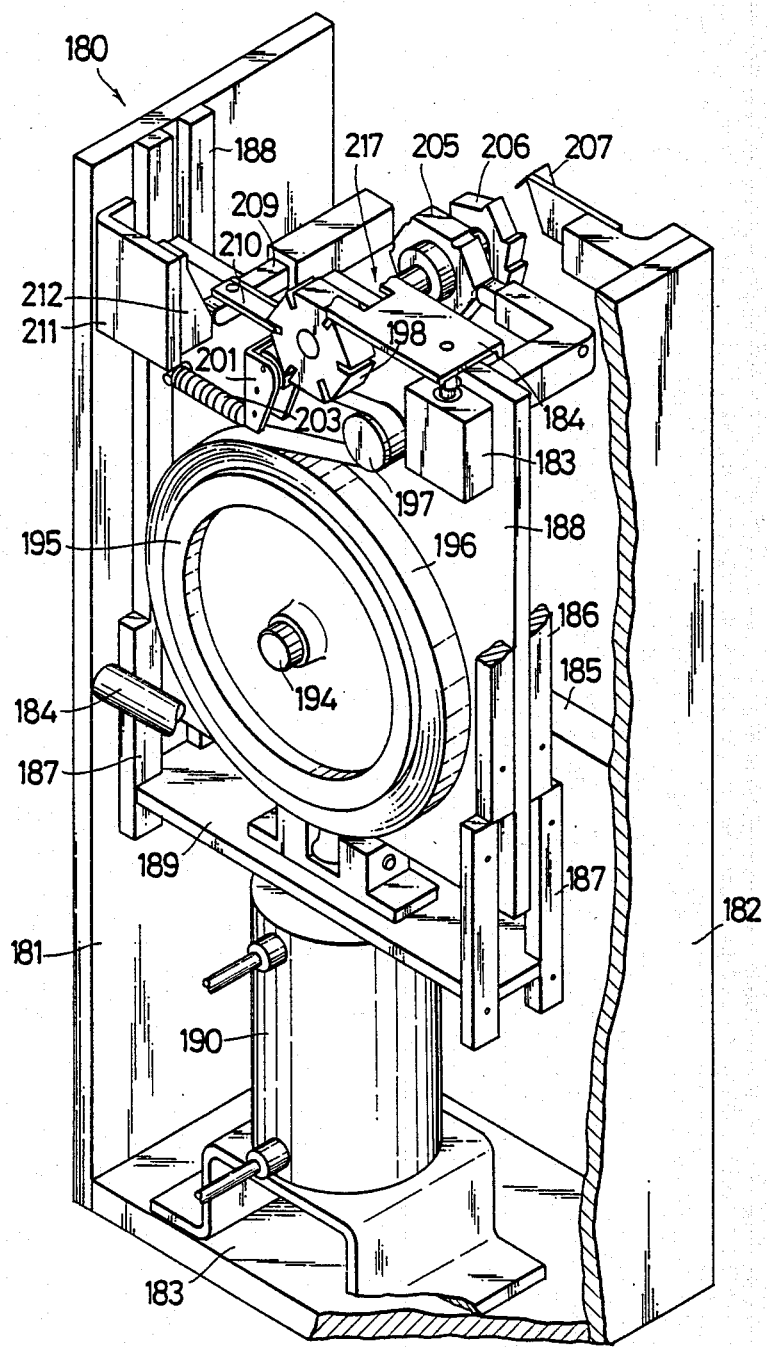
FIG. 23A is a perspective view of an adhesive tape application device.
Figure 23B:
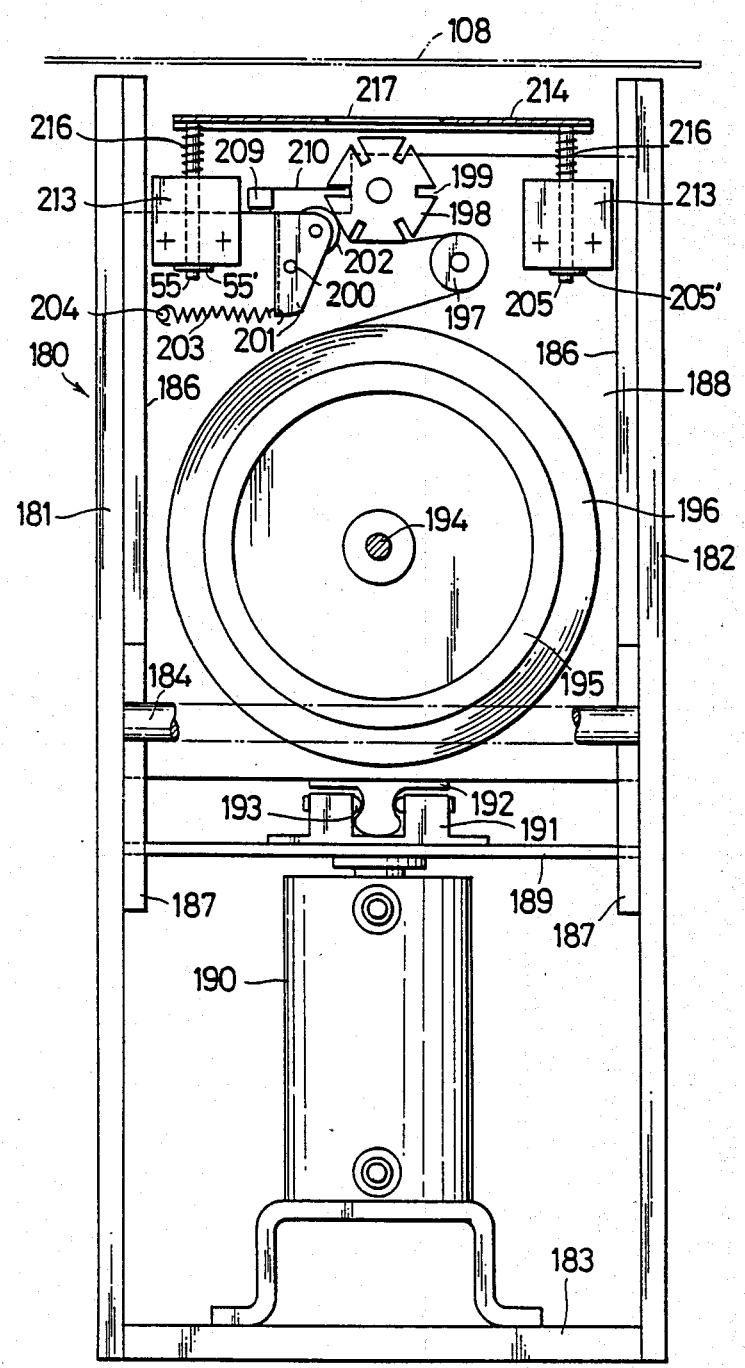
FIG. 23B is a front elevational view of the adhesive tape application device.
Figure 24A:
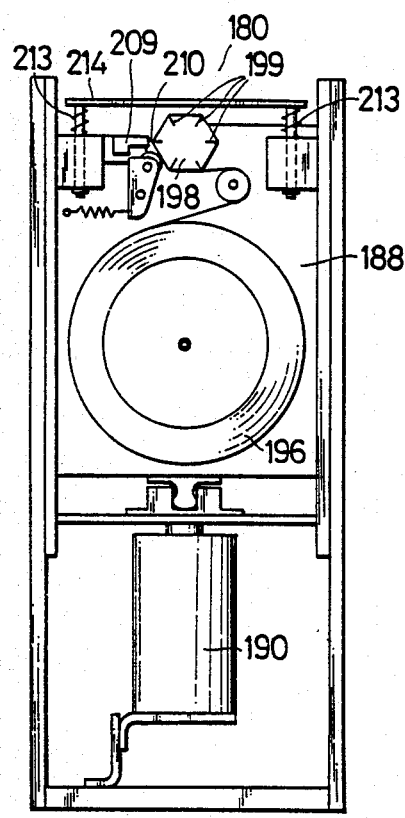
FIGS. 24A and 24B are front elevational views showing the function of the tape application device.
Figure 24B:
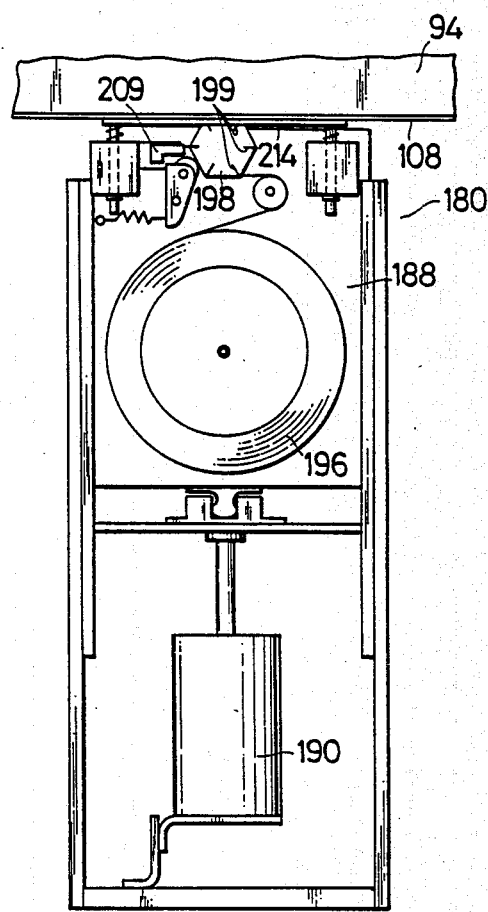

The working head 94 is transported to a tape applicator 180 which supplies strips of adhesive tape to the original film being held by it, and according to controlled movement of the sliding frame 64 and the saddle 86, it aligns portions of the original films held thereby with strips of adhesive tape to be applied by the tape applicator 180. FIG. 23A is a perspective view of the tape applicator 180, FIG. 23B is a front view thereof, and FIGS. 24A and 24B show the function of the tape applicator 180. A U-shaped frame is formed by a pair of side panels 181, 182, a bottom plate 183 and a pair of supporting rods 184, 185. A pair of vertical guide rails are installed on the inside of each of the side panels 181, 182, respectively. These guide rails are divided into upper rails 186 and lower rails 187, respectively, and a vertical board 188 is vertically and slidably inserted between the upper rails 186, while a horizontal board 189 is vertically and slidably inserted between the lower rails. The horizontal board 189 is connected to a piston rod of a pneumatic cylinder 190 installed on the bottom panel 183, and it is moved vertically by the pneumatic cylinder 190. A hook receiver 191 is mounted on the upper surface of the horizontal board 189, and a hook 192 is provided on the lower end of the vertical board 188. A pair of plungers 193, which are actuated inward, are installed to form a click stop mechanism which engages with the hook 192 at its neck. When the hook 192 engages with the receiver 191, both the vertical and the horizontal boards 188, 189 are driven by the pneumatic cylinder 190. When the vertical board 188 is raised by hand, the engagement is released and the vertical board 188 can be separated from the frame. Resetting of the vertical board 188 can be performed by inserting it between the guide rails 186. A wheel 195 is journaled on a shaft 194 projecting from the central part of the vertical board, and a roll of an adhesive tape 196 is carried by the wheel 195. Adhesive tape 196 of the type in which both faces thereof are coated with an adhesive material is used. A guide roller 197 is journally and rotatably provided on the upper part of the vertical board 188 and a hexagonal rotor 198 is also rotatably journalled on the uppermost part thereof. The hexagonal rotor 198 has a polygonal shape (in the embodiment it is shown as a "hexagon"), and slits 199 directing radially are provided in each corner. The circumferential surfaces of the rotor 198 are formed with a suitable material, such as fluoroplastic resin, so that the adhesive tape attached thereto may be easily peeled therefrom. It is also preferable to form the guide roller 197 with the same type of material. A rocking piece 201 is supported by a shaft 200 provided on the vertical board 188. A roller 202 is provided on the upper part of the rocking piece 201, and a spring means 203 is disposed between the lower part of the rocking piece 201 and a stud 204 projecting from the vertical board 188 so that the roller 202 may be pressed against the rotor 198. A positioning cam 205 and a ratchet wheel 206, which rotate together with the rotor 198, are provided on a rotor shaft and extend on the back side of the vertical board 188. The ratchet wheel 206 engages with a hook means 207, provided on the upper part of the side panel 182 when the vertical board 188 is elevated, and it rotates a certain angle (for example, in the embodiment it rotates 60 degrees). The positioning cam 205 is a polygonal shape (similar to that of the rotor) and has several recesses in each of the respective corners for positioning purposes, and it engages with a plunger 208 provided so as to direct the cam 205 and position one of the surfaces of the rotor 198 upwardly. A cutting arm 209, driven in front and rear directions, is provided on the left half of a stepped-down upper edge of the vertical board 188. The cutting arm 209 is actuated in the front direction with a suitable spring means (not shown), and when the rotor 198 is positioned by the cam 205, the knife 210 is set so that it may be aligned with one of the slits.

A cutter operating cam 212, with which the tip part of the cutting arm 209 engages, is provided with a bracket 211 on the upper part of the side panel 181. When the vertical board 188 descends, the cutting arm 209 is pushed by the cam 212 and the knife 210 is forced into one of the slits 199 of the rotor 198, and when the vertical board 188 elevates, the cutting arm 209 advances along a slope of the cam 212 and is pulled out of the slit 199. In addition, a pair of blocks 213 are provided on the uppermost part of the front side of the vertical board 188. With shafts 215 slidably and vertically inserted in these blocks 213, a press pan 214 is horizontally supported above the rotor 198. A spring 216, is provided between the press pan 214 and each of the blocks 213, respectively. Stopping washers 215', to limit the stoke of the press pan 214, are provided on the lower ends of the shafts 215 and an opening 217 of a size through which the rotor 198 can pass as bored in a central part of the press pan 214. The press pan 214 is normally remote from the rotor 198, as shown in FIG. 24A. When the vertical board 188 is elevated, the press pan 214 contacts with an original film held on the lower surface of the working head 94 which is placed over the upper part of the tape applicator 180, and depending on the elevation of the vertical board 188, the springs 216 are compressed to hold the original film on the working head 94 by suitable pressure. The function of the aforedescribed tape applicator will be described minutely in associating with the function of the present apparatus hereinafter.

Figure 13:
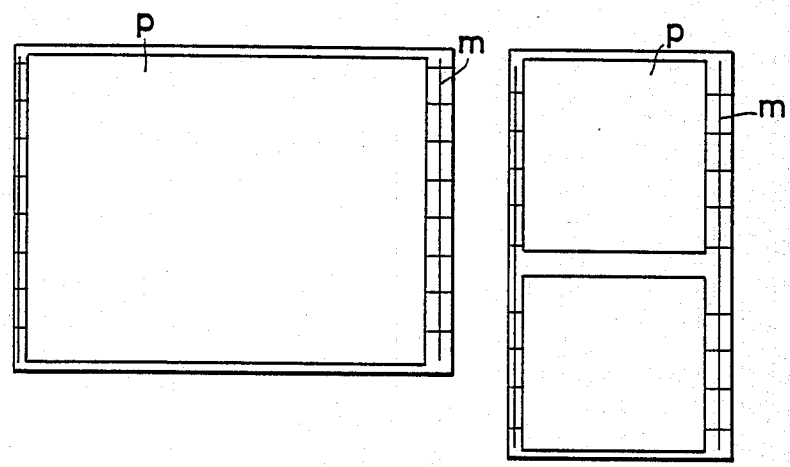
FIG. 13 shows original films equipped with register mark lines.
Figure 26:
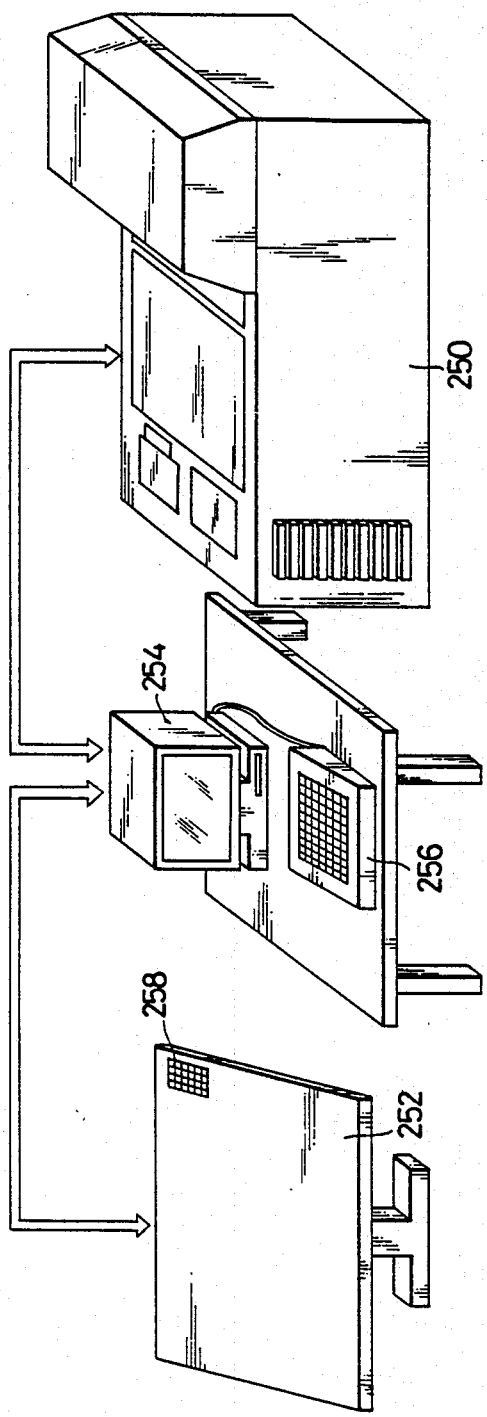
FIG. 26 shows a schematic perspective view of the entire composing apparatus according to the present invention.

FIG. 26 shows an outline of the entire system for composing works, in which a digitizer 252 providing with a menu tablet 258, a computer 254 having a key board 256 together with an apparatus 250 are shown. First, a plurality of sets of color separated films of original color films to be repurchased are prepared on a base sheet of paper, and the films of a first color (for example, yellow) in each of the plurality of sets of original color films are composed on the base sheet by adhering by hand according to a desired layout. Then the base sheet (hereinafter termed as the "first color base sheet") is set on the digitizer 252 by positioning with suitable means such as register pins or the like. The register marks (m) at the marginal edges, as shown in FIG. 13, of the original films composed on the first color base sheet are recorded together with a color separated picture (p). The positions of the registered marks (m) and sizes of the original films are measured with the digitizer, and the data is sent to the computer 254 to be stored. Reading out of the data can be performed by aligning a cursor line of the digitizer with the register marks (m), by human eyes, with a slight inaccuracy of a few hundred microns. By raising the base sheet receiving device 18, as shown in FIG. 2 by the dotted line, and by overlapping the first color base sheet in which the original film is adhered with a desired number of following sheets, it is set on the base sheet supplying device 14 by positioning with the register pins 16. The first color base sheet must be set as the uppermost sheet among the following sheets on which no original film is adhered. By aligning the leading edges of the original films of the second and the following colors in order, they are stored in the film cassette 20. By selecting the widths of the separated sections 48, 50 of the film cassette 20 so that they coincide with those of the original films, the side edges of the stored original films are also aligned. Further, the number of sizes of the color separated films recorded by a color scanner are relatively small and depends on the specifications of the color scanner being used, so that film cassettes having different widths in the sections 48, 50 may be prepared. After setting of the base sheets and the original films has been completed, the number of cassettes in which the original films are set and the other conditions or terms are set by the menu tablet 258 of the digitizer 252 or the key board 256 of the computer 254.

Sensor Calibration

The working head 94 travels to an illuminating area and an outer dark area of the positioning and composing table 6, and the sensitivities of the sensors 122 are calibrated at each of these areas. A detailed description therefor will be given hereinafter.

Figure 25A:
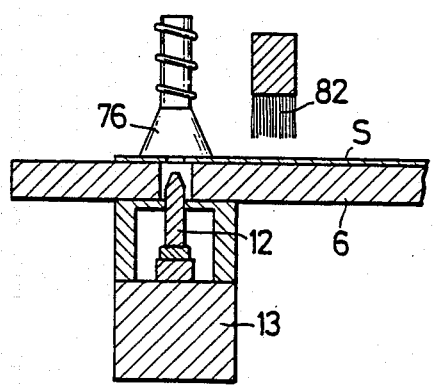
FIGS. 25A through 25E show a base sheet mechanism.
Figure 25B:
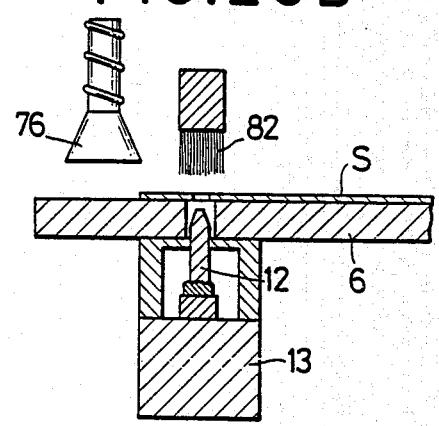
Figure 25C:
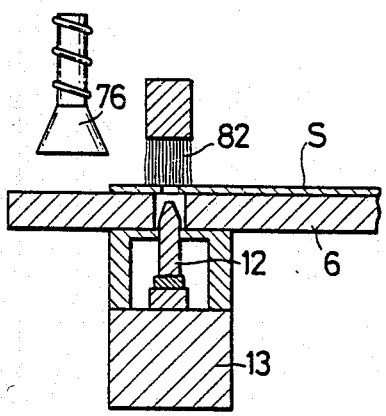
Figure 25D:
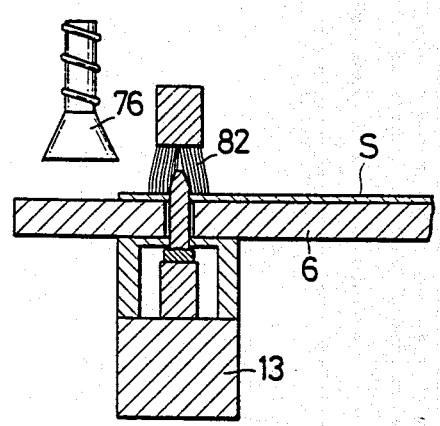
Figure 25E:
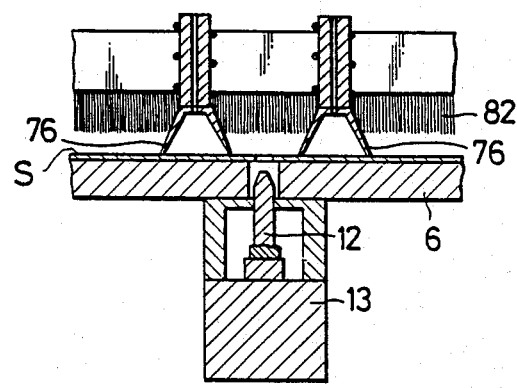

The supplying of base sheets is carried out as follows. The sliding frame 64 moves in the $X_2$ direction, as shown in FIG. 3, and the base sheet carrier 72 is aligned and stopped at the right above the register pins 16 of the base sheet supplying device 14. The cross bar 74 descends to a position at which the suckers 76 contact the first base sheet, and then the first color base sheet is held by an appropriate vacuum and elevated. The sliding frame 64 then moves in the $X_1$ direction and the film carrier 72 aligns above the register pins 12 of the positioning and composing table 6 and stops and descends the cross bar 74, as shown in FIG. 25A and FIG. 25E, and the base sheet (S) held by the suckers 76 is placed on the table 6. In this case, the register pins 12 of the table 6 are sunk into the surface of the table. The base sheet (S) is released from the suckers by stopping the vacuum and if necessary by blowing air. Next, by shifting the sliding frame 64, as shown in FIG. 25B, the brush 82 is aligned above the register pins 12, and the brush 82 is then descended by the pneumatic cylinder 84 to touch the base sheet (S), as shown in FIG. 25C. The register pins 12 are projected to the surface of the table 6 by the pneumatic cylinder 13, and are inserted into corresponding pin holes in the base sheet (S). If the pins are misaligned with the corresponding pin holes, the tapered portions of the pins contact with the edges of the pin holes and since the base sheet (S) is pressed against the table under light pressure by the brush 82, the film may be easily shifted in the horizontal direction. When the pins fully project past the surface, as shown in FIG. 25D, the pins holes of the sheet (S) are correctly engaged with the register pins 12 and accurate positioning is achieved. In the process shown in FIGS. 25A and 25B, the base sheet is placed on the surface of the table 6 except for the areas where the edge portions of the base sheet engaged with the register pins 12 can not be sufficiently fitted. In order to achieve sufficient fitting with each other, the sliding frame 64 is driven in the $X_2$ direction when the base sheet (S) is contacted with the brush 82 and the surface of the base sheet (S) is rubbed by the brush 82. Then, the vacuum pump (not shown) connected to the grooves 10, cut into the surface of the table 6, is operated to fix the base sheet (S) on the surface of the table 6 by suction. Then the register pins 12 are withdrawn into the table 6.

The sliding frame 64 and the saddle 86 are driven, based on data read and stored in the digitizer 252, to align the sensors 122 of the working head 94 with the portions of the register marks of the first color original film composed on the base sheet on the table 6. By projecting an image of the register mark onto the photocell 130 of the sensor, any difference existing between the data read in the digitizer 252 and the actual position of the register mark is measured. FIG. 16 shows an embodiment of an electrical measurement in which each of output signals of the photoelectric transducers 132a, 132b (in FIG. 15) is amplified by the respective amplifiers 220, 222, and digitized by A/D converters 224, 226, respectively. Thus, both of the output signals are input to a computing circuit 228.

Figure 18:
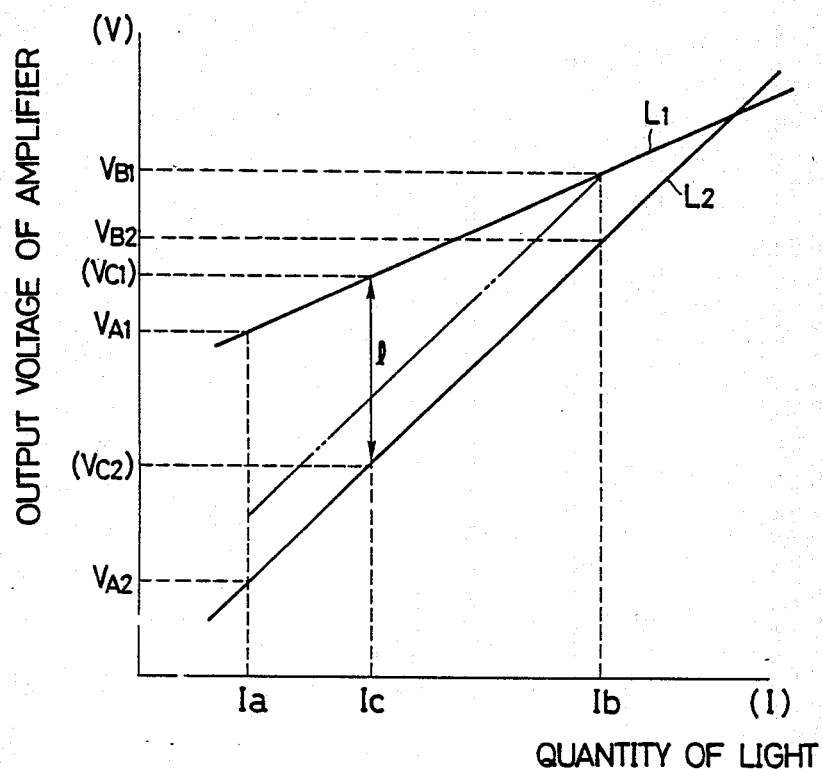
FIG. 18 shows the characteristics of a photoelectric transducer.

In FIG. 18, characteristic curves are shown which represent the relationship between light quantity (I) received by the transducers 132a, 132b and output voltages of the amplifiers 220, 222 corresponding to the signals, wherein "$L_1$" indicates the output characteristics of the transducer 132a, and "$L_2$" indicates the output characteristic of the transducer 132b. Calibration of each of the transducers is performed prior to measuring the position of the register marks. To carry out the calibration, the sliding frame 64 and the saddle 86 are driven to transport the working head 94 to the illuminated area of the positioning and composing table 6 and to the outer dark area, and the sensitivities of the transducers are calibrated at these areas. First, by setting the sensor 122 in the outer dark area, values of the output signals of the transducers 132a, 132b are input in the computing circuit 228. It is assumed that the quantity of light (light intensity) received by the transducers is "$I_a$", and the output values of the transducers are "$VA_1$" and "$VB_2$", respectively. Next, the sensor 122 is shifted to the transparent part in the illuminating area where there are no register marks, and values are measured and input to the computing circuit 228. The light intensity (quantity of light) received at this case is set to "$I_b$" and voltages of output signals are set to "$V_1$" and "$V_2$". By this twin calibration operation, characteristics of the transducers 132a, 132b shown in FIG. 18 are identified. The calibrated sensor 122 is set over the position of the register marks of the first color original film, as described above. If the center of the register mark line 134 aligns with borders of the transducers 132a, 132b, the light intensities impinging on the two respective transducers become the same value. If this value is assumed to be "$I_c$", then the difference between output levels, "$VC_1$" and "$VC_2$" of the transducers 132a and 132b becomes "l", in FIG. 18, based on linear characteristics of the transducers. Accordingly, if the difference between actual output values ($VC_1 - VC_2$) coincides with the value "l", the center of an image of the register mark line 134 is accurately aligned with the borders of the transducers. The value "l" shown in FIG. 18 is given geometrically by the following formula:

$$l = [(VA_1 - VA_2) - (VB_1 - VB_2)] \times (I_b - I_c)/(I_b - I_a) + (VB_1 - VB_2)$$

wherein the characteristics of the photoelectric transducers differ from one another for every element, these characteristics are linear so that, for example, if the description is given regarding the transducer 132a, $$(I_b - I_c)/(I_b - I_a) = (VB_1 - VC_1)/(VB_1 - VA_1).$$

Accordingly, $$l = [(8VA_1 - VA_2) - (VB_1 - VB_2)] \times (VB_1 - VC_1)/(VB_1 - VA_1) + (VB_1 - VB_2).$$

Therefore, it may be sufficient if this value becomes equal to the difference value ($VC_1 - VC_2$) between the output signals of the transducers 132a, 132b actually detecting the image 134. That is, the sensor 122 is transported in the X direction shown in FIG. 18 up to a position at which the value "m" of the following expression reduces to zero.

$$[(VA_1 - VA_2) - (VB_1 - VB_2)] \times (VB_1 - VC_2)/(VB_1 - VA_2) + (VB_1 - VB_2) - (VC_1 - VC_2) = m \ldots \quad (1)$$

In this case, since the values of ($VA_1$), ($VB_1$), ($VA_2$) and ($VB_2$) have already been stored in the computing circuit 228, the value "m" is determined by computing according to the output signals ($VC_1$) and ($VC_2$) of the transducers 132a, 132b. In the case of the value "m" of the formula (1) reducing to zero, as the center of the line image 134 is aligned with the border lines of the transducers 132a, 132b, transportation of the working head 94 provided with sensors 122 is stopped. The aforementioned operation is simultaneously carried out with respect to the other transducers 133a, 133b to align the center of the line image 134 with their border lines. When the desired sensors 122 are aligned with the respective register marks, by reading out X and Y positions of the working head 94, the gap between the data read out of the digitizer 252 and actual position of the register marks can be measured. The value of the gap is stored in the control device of the apparatus. In the above described operation, it is preferable to reduce "m" exactly to zero. However, it is difficult to control driving of the working head 94 so that the value of "m " may become zero, so that a suitable tolerance is allowed. It should be understood that the alignment of the sensors with the register marks also includes an allowed tolerance. In FIG. 17 another embodiment of the control circuit is shown. In this embodiment, the output of the transducer 132a is also fed to the computing circuit 228 through the A/D converted 224. However, the output of the transducer 132b is sent to a differential amplifier 230 in which the difference between the output of the former (transducer 132a) and that of the latter (transducer 132b) is produced, and then the difference is sent to the circuit 228. Thus, in this embodiment the calculations of $(VA_1-VA_2)$, $(VB_1-VB_2)$ and $(VC_1-VC_2)$ are carried out by the differential amplifier 230 not the computing circuit 228. Further, computing circuits of the afore-described type generally use, as shown in FIG. 19, a device composed of amplifiers 232, 234 and a differential amplifier 236. Each of outputs of the transducers 132a, 132b is amplified with the amplifiers 232, 234, respectively, and thereafter are input to the differential amplifier 236 and the difference is output. In this case also by adjusting the position of the sensors so that an output of the differential amplifier 236 may be reduced to zero, it is possible to make the desired alignment. However, if the transducers do not have identical characteristics, accurate centering cannot be achieved. For this reason, each of the amplifiers 232, 234 is provided with a respective variable resister 238, 240 by which the gain of each of the transducers is set to the same level and, with the variable resisters 242, 244, the offset voltage must be adjusted. This device requires a troublesome adjustment as afore-described while the devices of the above-described two embodiments do not require such adjustment.

The first color base sheet is removed from the positioning and composing table 6, after the position gap data of the register marks of all original films composed of the first color base sheet are detected and stored. Then, the first color base sheet is transported to the base sheet receiving device 18. This transportation is carried out by holding the trailing edge of the base sheet with the base sheet carrier 72. After the leading edge of the base sheet passes the position of the register pins 12, the pins 12 are projected to the surface of the table 6 by the pneumatic cylinder 13.

The following operation is then performed with respect to setting of the second base sheet. The uppermost sheet of the base sheets which are piled in the base sheet supplying device 14, and on which original films are not yet adhered, is transported to the positioning and composing table 6 by the same procedure as that of the first color base sheet, and with the register pins 12 and the brush 82, the film is positioned on the surface of the positioning and composing table 6 and held by vacuum.

Carrying and aligning operation of original films is performed as follows. Simultaneously with the setting of the second base sheet (or separately), the required film cassette 20 is transported from the waiting or standby position 22 to the supplying position 24 by the cassette driving means 26. The film carrier 96 which is driven together with the working head 94, by driving the sliding frame 64 and the saddle 86, is aligned directly above the edges of the original film stored in the film cassette 20. Then, the uppermost sheet of the pile of original films is held by vacuum and transported to the position detecting stage 4. The sheet (original film) is released from the carrier 96 and held on the stage 4 by the suction of groove 8. The working head 94 is moved by the same driving operation so that the sensors 122 may be aligned with designated portions of the stage 4. At this time, the register marks of the original film are aligned with the sensors 122, but it is impossible to eliminate all error and this results in the generation of a gap between the center of the register mark and the position of the optical axis of the sensor. Data relating to this gap is detected by the sensors 122 and stored as well as the register marks of the first color original films. The working head 94 shifts in the X and Y directions according to the stored gap data, and rotates in the $\theta$ direction to correct the gap. This results in a gap correction of the positioning error of the original film in the film cassette 20 and also corrects the position error of the original film generated during the original film being transported from the film cassette 20 to the stage 4. However, it is also possible to perform the afore-mentioned correcting operation by controlling shift and rotation of the working head 94 in the following step for positioning the original film held on the stage 4 to a base sheet placed on the positioning and composing table 6. After the sensors 122 are aligned with the register marks of the original film, the working head 94 descends to contact the original film held on the stage 4, and operates the vacuum pump to suck the original film with the groove 118. Simultaneously therewith, air is blown from the groove 8 of the stage 4, thus, the original film is held after being accurately aligned by the working head 94. Thereafter, the working head 94 is elevated and leaves the stage 4.

The tape applicator 180 is provided with a wheel 195 and a roll 196 of double faced type adhesive tape. The leading end part of the adhesive tape adheres to the circumference of the polygonal rotor 198. The leading end part of the adhesive tape is rotated to the upper surface of the polygonal rotor 198 by operating the pneumatic cylinder 190 several turns. The fed adhesive tape is cut into small strips by the knife 210. The faces of the rotor 198 are made of materials such as fluoroplastic resin or the like which the adhesive tape applied thereon can be easily peeled off. In the vicinity of the knife 210, the roller 202 holds the tape against the rotor 198, and prevents the tape from deviating from the rotor 198 when the tape is cut. The working head 94, which aligns and holds the original film, is transported to the tape applicator 180 from the stage 4, and when portions of the original film held by the working head 94 reach a position directly above the rotor 198, it stops. When the vertical board 188 ascends by means of the pneumatic cylinder 190, the cutter arm 209 advances along the slope of the cam 212, and the cutting knife 210 escapes from the slit 199 of the rotor 198. If the vertical board 188 is ascended higher, the ratchet 206 engages with the hook 207 and rotates the shaft of the rotor 198 a certain angle (in this embodiment 60 degrees), and one of the faces of the rotor 198, to which the strip of the adhesive tape is applied, is set to the underside thereof. This position of the rotor is held by the cam 205. If the vertical board 188 is ascended further, the press pan 214 first contacts with the original film held by the working head 94, and then the strip of the adhesive tape applied to the upper face of the rotor 198 adheres to a desired portion of the original film. Next, the vertical board 188 descends by driving the pneumatic cylinder 190 and the rotor 198 leaves the original film. Since the adhesion of the tape to the original film is greater than the adhesion to the face of the rotor 198 (which is easy peelable), the strip of adhesive tape separates from the face of the rotor 198 and adheres to the desired portion of the film. At this time the press pan 214 is still pressing the original film to the underside face of the working head 94 to maintain alignment of the film. Further, as the vertical board 188 descends, the cutter arm 209 begins to go back, depending on the rotation of the cam 212, and the knife 210 is inserted into a slit 199 of the rotor 198 to cut the tape. The afore-mentioned procedure for applying a strip of adhesive tape to a desired portion of the original film is repeated for each desired portion.

The working head 94, which holds the original film on which the strip of adhesive tape is applied, is raised and transported to the positioning and composing table 6, and according to the positioning data stored by the detected register marks of the first color original films, the original film held by the working head 94 is aligned with the same position of the first color base sheet where a corresponding first color original film is composed. After the alignment is finished, the working head 94 descends and contacts the original film with the second base sheet on the table 6, and by releasing the vacuum and supplying air from the hollow pipe presses the original film on the base sheet. Thus, the original film adheres to the base sheet by the strips of the tape. This procedure is repeated until all the second color original films have been composed on the base sheet. When the composing operation of the second color original films is completed, the base sheet is transported to the base sheet receiving device 18 by the base sheet carrier 72. The same operation is repeated for the third and all the following color original films. In this composing operation, according to the layout, there may be some cases in which a plurality of original films are positioned on the same portion of the base sheet in a partially overlapped manner. If the film holding face of the composing head 94 is hard, the areas where the original films overlap are pressed and other areas where no overlapping occurs, i.e. the areas where only one sheet of film is positioned, are not sufficiently pressed which results in an unstable composition. However, since the board 107 made of a flexible material is installed on the lower face of the working head 94 and the original film is pressed onto the base sheet by pneumatic pressure, the afore-mentioned defect can be eliminated. As shown in FIG. 20, in the case of pressing the original film (F) onto the base sheet (S), between the flexible board 107 and the working head 94 of the grooves 118, compressed air is fed from the hollow pipe and the flexible board 107 extends toward the lower part. Accordingly, the original films are pressed with approximately the same pressure in the areas where a plurality of original films overlapped as the other areas where only one sheet film is placed. Thus, good adhesion is achieved.

The afore-described processes can also be applied continuously to a composing operation in which a larger number of original films are used (that is, a plurality of kinds of prints). In this case, picking up data based on the digitizer 252 in preparing each layout and storing thereof, when each of base sheets for respective layouts is stored in the base sheet supplying device 14, each of base sheets on which the first color original films of the respective layouts are composed is piled orderly on the top of each group of base sheets. According to the above description, the first color original films composed on the first base sheet by hand are not removed from the base sheet, but are applied in the following process. However, it may be re-composed by using the apparatus of the present invention, the same as the original films which follow to those of the second color.

Another Embodiment

Figure 27:
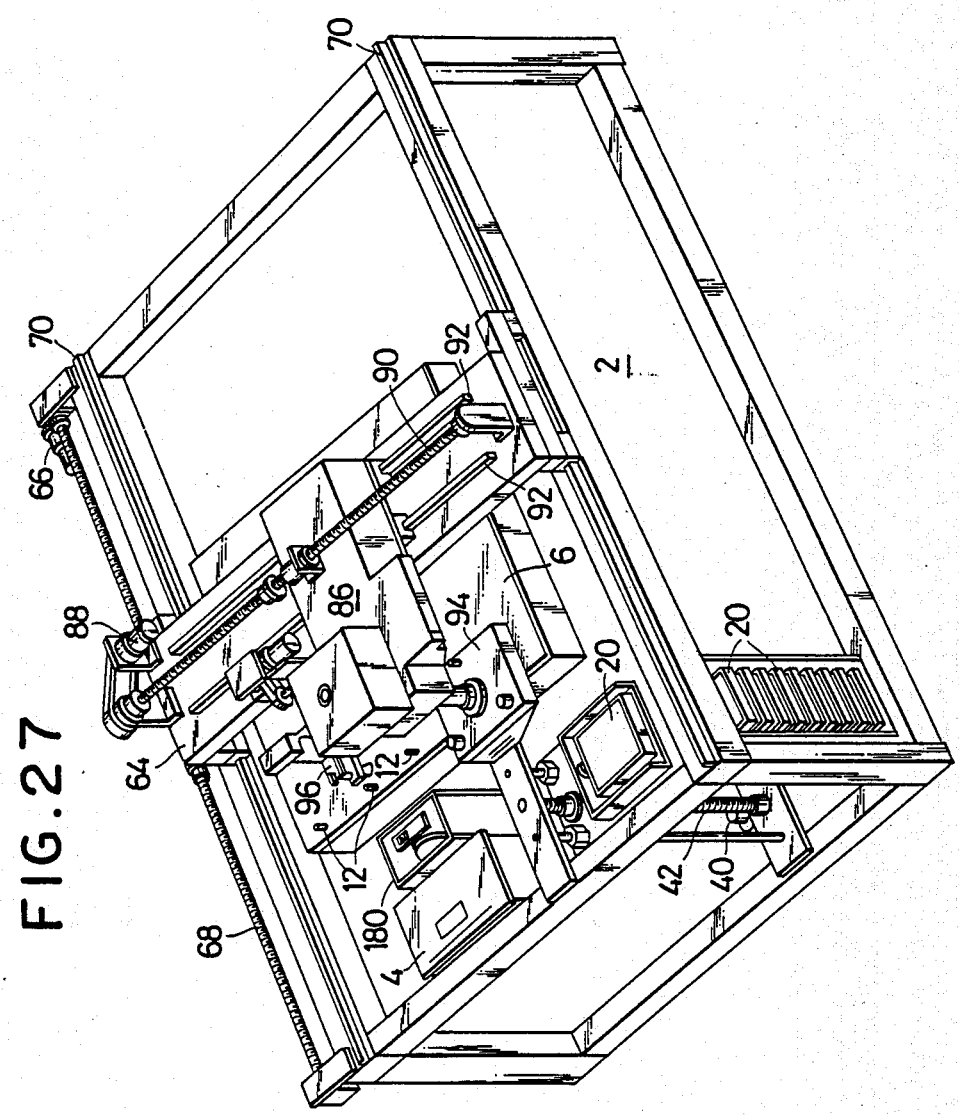
FIG. 27 shows a perspective view of another embodiment of the composing apparatus according to the present invention.

In FIG. 27, which shows a second embodiment of the present invention, the same reference numbers are given to identical parts and components of the first embodiment. The difference between the second and the first embodiments is that the loading and removing of the base sheet on the positioning and composing table 6 is carried out by hand. Accordingly, the base sheet supplying device 14, the base sheet receiving device 18 and the base sheet carrier 72 shown in FIG. 1 are omitted, and thus the apparatus can be compactly made so that floor space can be reduced, which results in cost savings. In this embodiment, the operation other than loading and removing the base sheet is the same as the first embodiment. The loading and removing operation of the base sheet can be performed by opening the upper surface of the table 6 by moving the sliding frame 64 to the right end portion of traveling stroke on the main frame 2.

While the preferred embodiments of the present invention have been shown and described, it will be evident that numerous changes and modifications may be made therein. It is, therefore, to be understood that this disclosure is not intended to limit the invention to the embodiments shown, but only by the scope of the claims which follow.

What is claimed are:

1. An apparatus for composing a plurality of original films which have register marks on desired positions of a base sheet by positioning and adhering thereon respectively, comprising:

a main frame;

a positioning and composing table having a positioning pins at one edge thereof for positioning a base sheet;

at least one film cassette for storing original films;

a position detecting stage on which an original film is set prior to being composed at measuring positions of register marks provided therewith;

an original film carrier for transporting one of said original films from said at least one film cassette onto said stage;

a working head for transporting said original film from said stage to said positioning and composing table to adhere said original film to said base sheet by pressing it at a desired location;

photoelectrical sensors provided with said working head for detecting register marks on said original film and measuring the position of said original film;

position setting means for setting positional data for moving said sensors to positions at which the register marks of the original film of a first color stuck on said base sheet are read out;

a sliding frame which moves on said main frame in one direction; and a saddle provided with said sliding frame so as to be slidable in a cross direction with said sliding frame and supporting said original film carrier and said working head;

wherein said positioning and composing table positions said base sheet on which the original film of the first color is stuck or the base sheets on which the original films of subsequent colors are to be stuck and composed one by one; and said photoelectrical sensors detect the register marks of the original film stuck on the base sheet for the first color on the positioning and composing table and the register marks of the original film mounted on the position detecting stage.

2. An apparatus according to claim 1, further comprising;

a base sheet supplying device installed in said main frame for piling and storing a plurality of base sheets;

a base sheet receiving device installed in said main frame for receiving a base sheet after original films having been composed thereon; and a base sheet carrier which is provided to said sliding frame and transports a base sheet to said positioning and composing table from said base sheet supplying table, and further transports said base sheet to said base sheet receiving device from said positioning and composing table.

3. An apparatus according to claim 1, wherein a tape applicator is provided between said position detecting stage and said positioning and composing table for applying tips of an adhesive tape to said original film held on said working head.

4. An apparatus according to claim 1, wherein a plurality of film cassettes are overlappedly installed at a waiting position, and a cassette driving means which shifts one of said plurality of film cassettes being set at an engaging height by vertical movement to a supplying position in engagement therewith is provided;

each of said film cassettes being provided with at least one supporting board on which original films are piled and spring means for actuating said supporting board upwardly.

5. An apparatus according to claim 1, wherein said original film carrier is further comprised with a plurality of suckers which descend to a height at which the top surface of said original films in said film cassette of said supplying position and move between a first position and a second position to perform sucking operation at the second position by vacuum pressure.

6. An apparatus according to claim 1, wherein said photoelectric sensor is comprised at least one pair of electric transducers of same size and same characteristics which are set side by side, an image of a register mark line is projected onto border lines of said photoelectric transducers to ascertain alignment said image with the border lines by outputs of said transducers.

7. An apparatus according to claim 1, wherein said working head comprises:

a main block having an opening for at least one of sucking and injecting air at the underside surface of said main block and having suction grooves for engaging with said opening; and a vacuum suction means and a compressed air supplying means, at least one of said means is connected to said opening through pipe line switching valves.

8. An apparatus for composing a plurality of original films which have register marks on desired positions of a base sheet by positioning and adhering thereon respectively, comprising:

a main frame;

a positioning and composing table having a positioning means at one edge thereof for positioning a base sheet;

at least one film cassette for storing original films;

a position detecting stage on which an original film is set prior to being composed at measuring positions of register marks provided therewith;

an original film carrier for transporting one of said original films from said at least one film cassette onto said stage;

a working head for transporting said original film from said stage to said positioning and composing table to adhere said original film to said base sheet by pressing it at a desired location;

photoelectrical sensors provided with said working head for detecting register marks on said original film and measuring the position of said original film, said photoelectric sensors being integral with said working head to provide high repositioning precision of said working head during composing;

position setting means for setting positional data for moving said sensors to positions at which the register marks of the original film of a first color stuck on said base sheet are read out;

a sliding frame which moves on said main frame in one direction; and a saddle provided with said sliding frame so as to be slidable in a cross direction with said sliding frame and supporting said original film carrier and said working head;

wherein said positioning and composing table positions said base sheet on which the original film of the first color is stuck or the base sheets on which the original films of subsequent colors are to be stuck and composed one by one; and said photoelectrical sensors detect the register marks of the original film stuck on the base sheet for the first color on the positioning and composing table and the register marks of the original film mounted on the position detecting stage.

* * * * *